(12) United States Patent
van Bentum et al.

(10) Patent No.: US 7,144,786 B2
(45) Date of Patent: Dec. 5, 2006

(54) TECHNIQUE FOR FORMING A TRANSISTOR HAVING RAISED DRAIN AND SOURCE REGIONS WITH A REDUCED NUMBER OF PROCESS STEPS

(75) Inventors: Ralf van Bentum, Radebeul (DE); Scott Luning, Dresden (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 21 days.

(21) Appl. No.: 10/891,996

(22) Filed: Jul. 15, 2004

(65) Prior Publication Data
US 2005/0095796 A1 May 5, 2005

(30) Foreign Application Priority Data
Oct. 31, 2003   (DE) ................................ 103 51 006

(51) Int. Cl.
*H01L 21/336* (2006.01)
(52) U.S. Cl. ...................... 438/300; 438/301; 438/305
(58) Field of Classification Search ........ 438/299–303, 438/305–307, 595, 607, 197, 199
See application file for complete search history.

(56) References Cited

U.S. PATENT DOCUMENTS

| | | | |
|---|---|---|---|
| 5,200,352 A | 4/1993 | Pfiester | 437/44 |
| 6,137,149 A | 10/2000 | Kodama | 257/408 |
| 6,254,676 B1 | 7/2001 | Yang et al. | 117/95 |
| 6,255,182 B1 * | 7/2001 | Wieczorek et al. | 438/305 |
| 6,316,303 B1 * | 11/2001 | Lin et al. | 438/222 |
| 6,489,206 B1 * | 12/2002 | Chen et al. | 438/300 |
| 6,506,649 B1 * | 1/2003 | Fung et al. | 438/300 |
| 6,555,437 B1 | 4/2003 | Yu | 438/300 |

* cited by examiner

*Primary Examiner*—Thanhha S. Pham
(74) *Attorney, Agent, or Firm*—Williams, Morgan & Amerson, P.C.

(57) ABSTRACT

By using sidewall spacers adjacent to a gate electrode structure both as an epitaxial growth mask and an implantation mask, the complexity of a conventional process flow for forming raised drain and source regions may be significantly reduced, thereby reducing production costs and enhancing yield by lowering the defect rate.

7 Claims, 5 Drawing Sheets

TECHNIQUE FOR FORMING A
TRANSISTOR HAVING RAISED DRAIN AND
SOURCE REGIONS WITH A REDUCED
NUMBER OF PROCESS STEPS

BACKGROUND OF THE INVENTION

1. Field of the Invention

The present invention generally relates to the fabrication of integrated circuits, and, more particularly, to the formation of field effect transistors having epitaxially grown raised drain and source regions so as to provide extremely shallow PN junctions.

2. Description of the Related Art

The fabrication of integrated circuits requires the formation of a large number of circuit elements on a given chip area according to a specified circuit layout. Generally, a plurality of process technologies are currently practiced, wherein, for logic circuitry such as microprocessors, storage chips and the like, CMOS technology is currently the most promising approach due to the superior characteristics in view of operating speed and/or power consumption. During the fabrication of complex integrated circuits using the CMOS technology, millions of complementary transistors, i.e., N-channel transistors and P-channel transistors, are formed on an appropriate substrate. Typically, a MOS transistor, irrespective of whether an N-channel transistor or a P-channel transistor is considered, comprises so-called PN-junctions that are formed at an interface of highly doped drain and source regions with an inversely doped channel region disposed between the drain region and the source region. The conductivity of the channel region is controlled by a gate electrode formed above the channel region and separated therefrom by a thin insulating layer. The conductivity of the channel region depends on the dopant concentration, the mobility of the majority charge carriers, and, for a given extension of the channel region in the transistor width direction, on the distance between the source and drain region, which is also referred to as channel length. Hence, in combination with the capability of rapidly creating a conductive channel below the insulating layer upon application of a specified control voltage to the gate electrode, the conductivity of the channel region substantially determines the characteristics of the MOS transistors. For this reason, the channel length represents a dominant design criterion and a size reduction thereof provides an increased operating speed of the integrated circuits.

The shrinkage of the transistor dimensions, however, entails a plurality of issues associated therewith which have to be addressed so as to not unduly offset the advantages obtained by steadily decreasing the channel length of MOS transistors.

One problem in this respect is the requirement of extremely shallow PN junctions. That is, the depth of the source and drain regions with respect to an interface formed by the gate insulating layer and the channel region has to be decreased as the channel length is reduced so as to maintain the required controllability of the conductive channel. The depth of the source and drain regions substantially determines the sheet resistance thereof, which may not be arbitrarily reduced by correspondingly increasing the dopant concentration in the source and drain regions since an extremely high dopant concentration may give rise to increased leakage currents. Furthermore, the dopants implanted into these regions at very high concentrations may not be completely activated by conventional rapid thermal anneal cycles without negatively affecting the overall dopant profile within the source and drain regions. That is, for a desired channel length, defined by the PN junctions, an increased dopant concentration requires higher temperatures and/or a prolonged duration of the corresponding anneal cycles, thereby, however, influencing the dopant profile forming the PN junctions by the inevitable thermal diffusion of the dopants, which finally may lead to a non-acceptable variation of the finally achieved channel length.

In an attempt to further reduce the sheet resistance of the drain and source regions, the conductivity thereof is frequently increased by forming a metal silicide of superior conductivity compared to a highly doped silicon. However, since the penetration depth of the metal silicide is restricted by the depth of the PN junctions, the improvement in conductivity in these regions is therefore coupled to the depth of the corresponding PN junctions. Moreover, in many CMOS technologies, a corresponding metal silicide is simultaneously formed on the gate electrode, wherein a shallow junction depth therefore also creates a very shallow metal silicide in the gate electrode, thereby providing only limited improvement in gaining superior gate electrode conductivity.

In one approach, extremely shallow source and drain regions may be formed by raising the source and drain regions above the gate insulation layer/channel region interface and maintaining the drain/source dopant concentration at an acceptable level while providing for the possibility of forming highly conductive metal silicide regions without being restricted by the actual depth of the PN junctions due to the increased size of the raised drain and source regions.

With reference to FIGS. 1a–1d, a typical conventional process flow for forming raised drain and source regions will now be described in more detail. FIG. 1a schematically shows a cross-sectional view of a field effect transistor 100 at an early manufacturing stage. The transistor 100 comprises the substrate 101, for instance a bulk silicon substrate or an SOI (silicon-on-insulator) substrate including a buried insulating layer. Above the substrate 101, a substantially crystalline layer 102 is formed with a thickness that is appropriate for forming PN junctions and a channel region therein. For instance, the transistor 100 may represent an SOI transistor with a thickness of the silicon layer 102 in the range of approximately 20–100 nm. A gate electrode 103, comprised of polysilicon, is formed above the silicon layer 102 and is separated therefrom by a gate insulation layer 104. The gate insulation layer 104 may be formed in sophisticated devices by a nitrogen-containing silicon dioxide layer with a thickness of approximately 0.6–4.0 nm. The residue 105 of an anti-reflective coating covers a top surface 103a of the gate electrode 103, while the sidewalls 103b thereof, as well as the remaining surface of the silicon layer 102, are covered by an oxide liner 106.

The transistor 100 as shown in FIG. 1a may be formed in accordance with the following process flow. The substrate 101 may be obtained by a manufacturer of substrates in the form of a silicon bulk substrate or in the form of an SOI substrate, wherein the SOI substrate may comprise a crystalline silicon layer that may be formed in accordance with well-established wafer bonding techniques. The silicon layer 102 having the appropriate thickness may then be formed by corresponding process techniques, such as chemical mechanical polishing to thin a given silicon layer of an SOI substrate to a desired thickness and/or by epitaxial growth of silicon on the exposed surface of the SOI substrate or the bulk substrate. The epitaxial growth technique of a semiconductor material is a deposition technique in which the deposited material layer forms a crystalline structure in conformity with the crystalline structure of the underlying material as long as the deposited material is able to form a lattice that is sufficiently similar in structure and lattice spacing to the lattice of the underlying material. After the formation of the silicon layer 102, an insulating layer is formed having a thickness and a composition that are appropriate for forming the gate insulation layer 104. To this end, sophisticated oxidation and/or deposition techniques may be used as are well established in the art. Thereafter, a polysilicon layer of appropriate thickness is deposited by low pressure chemical vapor deposition. Next, an anti-reflective coating, for instance comprised of silicon oxynitride, and a resist layer are deposited and are patterned by sophisticated photolithography so as to form an etch mask for a subsequent anisotropic etch process for patterning the gate electrode 103 from the deposited polysilicon layer. Thereafter, the gate insulation layer 104 may be patterned and subsequently the oxide liner 106 may be formed by an appropriately designed oxidation process.

FIG. 1b schematically shows the transistor 100 having formed thereon sidewall spacer elements 107 comprised of a material, such as silicon nitride, that exhibits a moderately high etch selectivity with respect to the underlying oxide liner 106 so that the spacers 107 may be readily removed after a selective epitaxial growth process. The sidewall spacers 107 may be formed by well-established techniques, including by deposition, e.g., plasma enhanced chemical vapor deposition, of a silicon nitride layer of a specified thickness and a subsequent anisotropic etch process, which reliably stops on and in the liner oxide 106, thereby leaving the spacers 107. A width 107a of the spacer 107 is readily controllable by appropriately adjusting the thickness of the silicon nitride layer. Hence, a lateral extension of epitaxial growth regions adjacent to the gate electrode 103 is substantially determined by the spacer width 107a.

FIG. 1c schematically shows the device 100 with selectively grown silicon regions 108 above the silicon layer 102, wherein a lateral distance of the regions 108 from the gate electrode 103 substantially corresponds to the spacer width 107a (see FIG. 1b) plus the minimal thickness of the liner oxide 106. The transistor 100 as shown in FIG. 1c may be obtained by the following processes. Starting from the device as shown in FIG. 1b, the liner oxide 106 is selectively etched so as to expose the silicon layer 102 at portions that are not covered by the spacers 107, the gate electrode 103 and any isolation structures (not shown). Before and/or after the removal of the liner oxide 106, well-established cleaning procedures may be carried out so as to remove oxide residues and other contaminants that may have accumulated in a surface region of the silicon layer 102. Thereafter, silicon is selectively grown on exposed portions of the silicon layer 102, thereby forming the silicon regions 108 with a specified thickness in conformity with design requirements. Thereafter, the spacer 107 is removed by a selective etch process, for instance by using hot phosphoric acid, which exhibits an excellent etch selectivity to silicon dioxide and silicon. During this etch process, the residue 105 on top of the gate electrode 103 may also be removed. Thereafter, a conventional process sequence may be performed, as is the case for transistor devices without the additional selectively grown silicon regions 108. That is, an appropriate number of sidewall spacers may be formed, followed by appropriately designed implantation sequences, so as to establish a required dopant profile in the silicon layer 102.

FIG. 1d schematically shows the transistor 100 after the above-mentioned transistor formation process using, for instance, three different sidewall spacers. In FIG. 1d, a first sidewall spacer 109, for instance comprised of silicon dioxide, is located adjacent to the oxide liner 106 and has an appropriate thickness for profiling the dopant concentration in the vicinity of the gate electrode 103 during a subsequent implantation sequence. A second spacer 110 is located next to the first spacer 109 and separated therefrom by an additional liner 106a, followed by an oxide liner 111 and a third spacer 112. The width of these spacers 109 and 112 is appropriately selected so as to obtain the desired dopant extension regions 113 and the drain and source regions 114, thereby defining a channel region 115 between the extensions 113 with a specified channel length 116.

During the formation of the spacer 109, if comprised of silicon dioxide, the liner 106 is typically etched off the surface portion of the semiconductor layer 102. Therefore, usually the additional liner 106a is deposited prior to the formation of the spacer 110. If the first spacer 109 is comprised of silicon nitride, the liner 106 is preserved during the anisotropic etch for the formation of the spacer 109, however, with possibly an inhomogeneous thickness owing to the etch-induced damage. Therefore, the remaining liner 106 may be removed and the additional liner 106a may also be deposited in this case. Generally, the formation of the spacers 109, 110 and 112 may be accomplished by well-established spacer technologies, such as described with reference to the spacer 107, wherein the corresponding spacer width may be controlled by the corresponding deposition thicknesses of the respective spacer layers, for instance comprised of silicon nitride, wherein the additional liner 106a and the oxide liner 111 provide the required etch selectivity in anisotropically patterning the spacers.

As a result, the above-described process flow enables the formation of required shallow PN junctions in the form of the extensions 113, while nevertheless providing a low contact resistance to the drain and source regions 114 by providing the additional selectively grown silicon regions 108, which may be used to receive a highly conductive metal silicide, wherein the silicidation process does not adversely affect the extensions 113, nor is the silicidation process restricted by the depth of the extensions 113 and the drain and source regions 114.

Although the process flow described above provides significant improvements in forming raised drain and source regions, the above-described process flow requires a plurality of additional steps, for instance the formation of the disposable spacers 107, compared to devices without raised drain and source regions. The additional process steps may, however, significantly contribute to the production costs and also cause the potential risk of increasing the defect rate of the manufacturing process, thereby reducing the production yield.

In view of the above situation, therefore, a need exists for an improved technique that enables the formation of raised source and drain regions providing the advantages of the above conventional process flow while still offering the potential for simplifying the process flow.

SUMMARY OF THE INVENTION

Generally, the present invention is directed to a technique that enables the formation of raised drain and source regions with a reduced number of process steps compared to the previously described conventional process flow. According to illustrative embodiments of the present invention, a sidewall spacer used as an epitaxial growth mask also serves as an implantation mask for laterally profiling a dopant concentration during the formation of drain and source regions.

In one particular illustrative embodiment of the present invention, a method comprises forming a gate electrode above a semiconductor region and forming sidewall spacers on sidewalls of the gate electrode. Then, raised semiconductor regions are epitaxially grown above the semiconductor region and adjacent to the sidewall spacers. Finally, a dopant species is introduced into the raised semiconductor region and the underlying semiconductor region by ion implantation, wherein the sidewall spacers are used as an implantation mask.

In a further illustrative embodiment of the present invention, a method comprises forming a gate electrode above a semiconductor region and forming sidewall spacers on sidewalls of the gate electrode. Raised semiconductor regions are epitaxially grown above the semiconductor region and adjacent to the sidewall spacers. Next, a size of the sidewall spacers is reduced and a dopant species is introduced into the raised semiconductor region and the underlying semiconductor region by ion implantation, wherein the sidewall spacers of reduced sized are used as an implantation mask.

BRIEF DESCRIPTION OF THE DRAWINGS

The invention may be understood by reference to the following description taken in conjunction with the accompanying drawings, in which like reference numerals identify like elements, and in which.

Figure 1A:
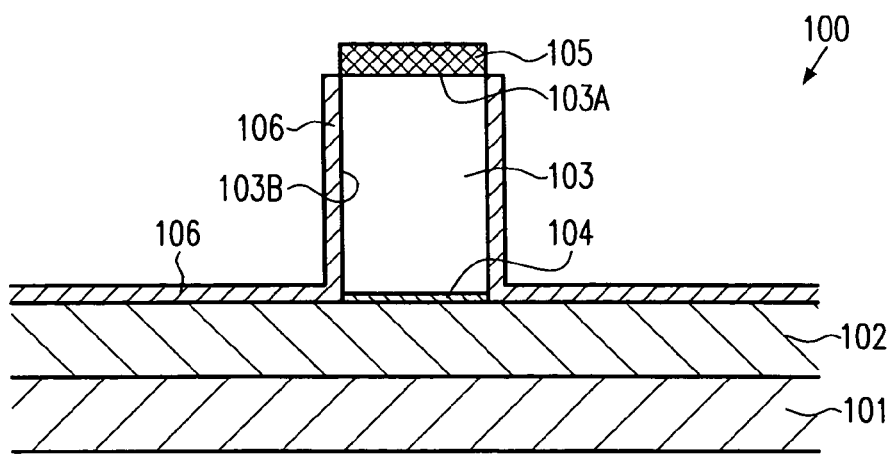
FIGS. 1a–1d schematically show cross-sectional views of a conventional transistor device including raised drain and source regions during various manufacturing stages.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept of forming a semiconductor device having raised drain and source regions, which are obtained by a selective epitaxial growth process using sidewall spacers of a gate electrode as epitaxial growth masks, wherein these sidewall spacers may be additionally used as an implantation mask for one or more implantation steps in profiling a lateral dopant concentration. Using the sidewall spacers for both the epitaxial growth step and at least one implantation step, the conventional process flow described earlier may be simplified, thereby reducing production costs and also providing the potential for improving production yields due to a possibly reduced defect rate.

Figure 2A:
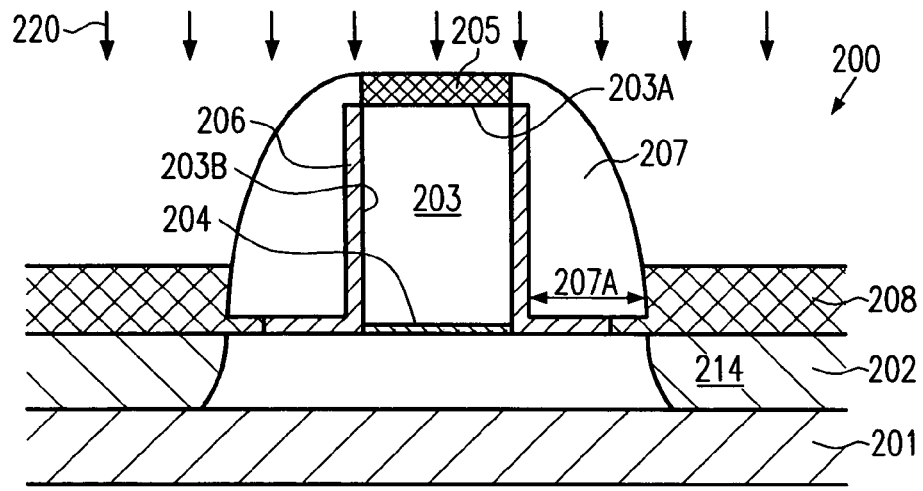
FIGS. 2a–2b schematically show a semiconductor device having raised drain and source regions, wherein disposable sidewall spacers are used as an implantation mask according to one illustrative embodiment of the present invention.

With reference to the drawings, further illustrative embodiments of the present invention will now be described in more detail. FIG. 2a schematically shows a cross-sectional view of a semiconductor device 200 comprising a substrate 201 having formed thereon a semiconductor layer 202. The substrate 201 may represent any appropriate semiconductor substrate, such as a silicon substrate, and may represent, in one particular embodiment, an SOI (silicon-on-insulator) substrate, since the SOI technology is considered a promising circuit architecture in forming extremely scaled CMOS logic circuitry, storage chips and the like. Depending on the substrate used, the semiconductor layer 202 may represent a single substantially crystalline semiconductor layer or may represent a portion of semiconductor substrate. For instance, the semiconductor layer 202 may be provided in the form of a silicon layer having a thickness in the range of approximately 5–50 nm. A gate electrode 203, for instance comprised of polysilicon when silicon-based semiconductors are considered, is formed above the semiconductor layer 202, wherein a gate insulation layer 204 separates the gate electrode 203 from the semiconductor layer 202. A top surface 203a of the gate electrode 203 is covered by a cap layer 205, for instance comprised of silicon nitride or silicon oxynitride, while sidewalls 203b of the gate electrode 203 are covered by a liner 206, which also covers a portion of the semiconductor layer 202. Sidewall spacers 207 are formed adjacent to the liner 206 and have a width, i.e., the lateral dimension at the foot of the sidewall spacers 207, that is indicated as 207a. Finally, epitaxially grown raised semiconductor regions 208 are formed adjacent to the sidewall spacers 207.

Figure 1B:
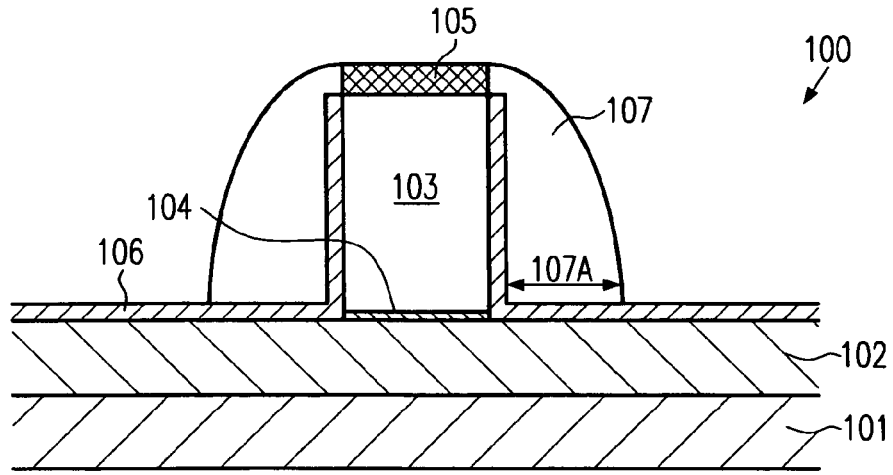
Figure 1C:
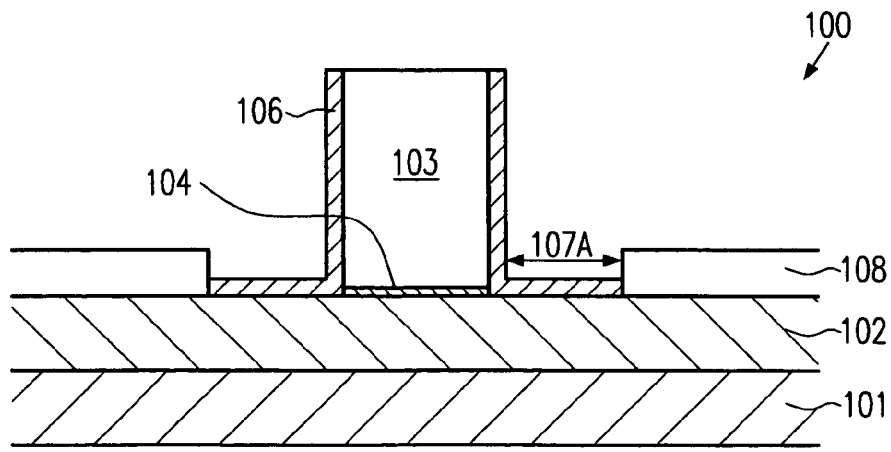
Figure 1D:
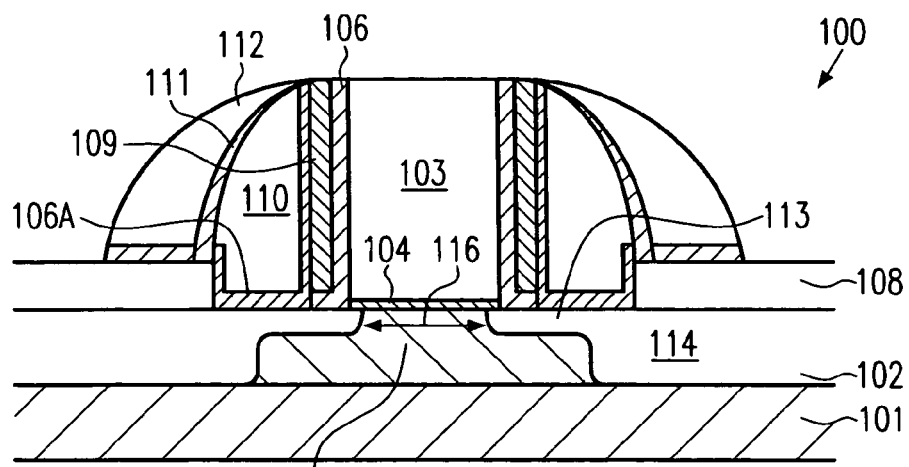

A typical process flow for forming the semiconductor device 200 as shown in FIG. 2a may, in principle, comprise the same process steps as are already described with reference to FIGS. 1a–1c. Contrary to the conventional process flow, however, during the formation of the sidewall spacers 207, the width 207a thereof is adjusted so as to provide the desired lateral distance to the gate electrode 203 in a subsequent implantation sequence, indicated by 220. That is, since the spacer width 207a may be precisely adjusted during the deposition of a spacer layer that is subsequently patterned by an anisotropic etch process, the corresponding profiling of the dopant concentration by means of the spacer width 207a is well controllable in a similar way as is described with reference to FIG. 1d. Consequently, a lateral dopant profile is obtained by means of the ion implantation 220, thereby forming deep source and drain regions 214, as is required for the specified transistor performance. The implantation parameters, such as implantation energy and implantation dose, may, for a given transistor design structure, be selected differently compared to the conventional process flow so as to take into account the additional blocking effect of the cap layer 205 that still covers the upper surface 203a of the gate electrode 203, whereas, in the conventional case, the gate electrode 203 is directly exposed to the ion bombardment. Hence, the energy of the implantation 220 may be adapted, which may readily be accomplished by a corresponding simulation calculation taking into consideration the thickness of the cap layer 205 and the material composition thereof. In other embodiments, the dose or the dose and energy may be adapted so as to compensate for the additional blocking effect of the cap layer 205. Similarly, any anneal cycles that are to be carried out later on so as to activate the implanted dopants and to, at least partially, cure implantation-induced lattice damage may also be adapted, if required, to the newly selected implantation parameters.

It should be noted that the semiconductor device 200 is representative of any type of transistor element, such as a P-channel transistor and an N-channel transistor, wherein, typically, different implantation processes are required for the different type of transistor elements. That is, the implantation 220 may represent a P-type implantation, wherein device areas containing N-type transistor elements are covered by an appropriate resist mask, whereas, during a corresponding implantation process for the N-type transistor elements, the regions containing the P-type transistor elements are covered by a respective resist mask.

After the completion of the implantation 220, the sidewall spacer 207 may be removed, possibly simultaneously with the cap layer 205, for instance by means of hot phosphoric acid if the sidewall spacers 207 and the cap layer 205 are substantially comprised of silicon nitride.

Figure 2B:
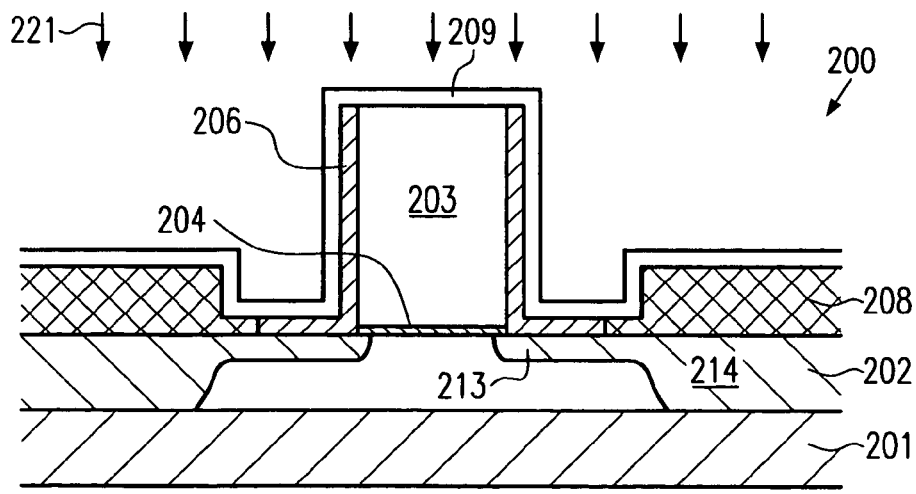

FIG. 2b schematically shows the semiconductor device 200 after the removal of the spacers 207 and the cap layer 205 and with an offset spacer 209 formed thereon. The offset spacer 209 may be provided in the form of a silicon dioxide layer having an appropriate thickness so as to provide the desired offset to the gate electrode 203 in laterally profiling the dopant concentration in the semiconductor layer 202. As shown in FIG. 2b, a further implantation process 221 is performed to create extension regions 213 that connect to the deep source and drain regions 214. In other embodiments, the dopant profiling by means of the sidewall spacers 207 and the offset spacers 209 may not be considered sufficient for laterally profiling the dopant concentration. Therefore, one or more additional sidewall spacers may be formed, as is, for instance, explained with reference to FIG. 1d, so as to obtain a desired lateral dopant profile in the semiconductor layer 202, thereby creating the desired transistor performance. After completion of the implantation sequence 221 that may be followed by further sidewall spacer formation steps and implantation cycles, a corresponding anneal cycle is performed so as to activate the dopants and at least partially re-crystallize implantation-induced damage in the raised semiconductor regions 208 and the semiconductor layer 202. Thereafter, the semiconductor device 200 may be completed, as is described with reference to FIG. 1d.

Irrespective of the process sequence for completing the device 200, using the disposable sidewall spacers 207 as implantation masks during the implantation 220 reduces the number of process steps, i.e., reduces the number of spacer formation processes, at least by one, compared to a conventionally manufactured device having the same transistor characteristics. Accordingly, production costs may be lowered and the risk of creating defects during the spacer manufacturing sequence is also significantly reduced.

Figure 3A:
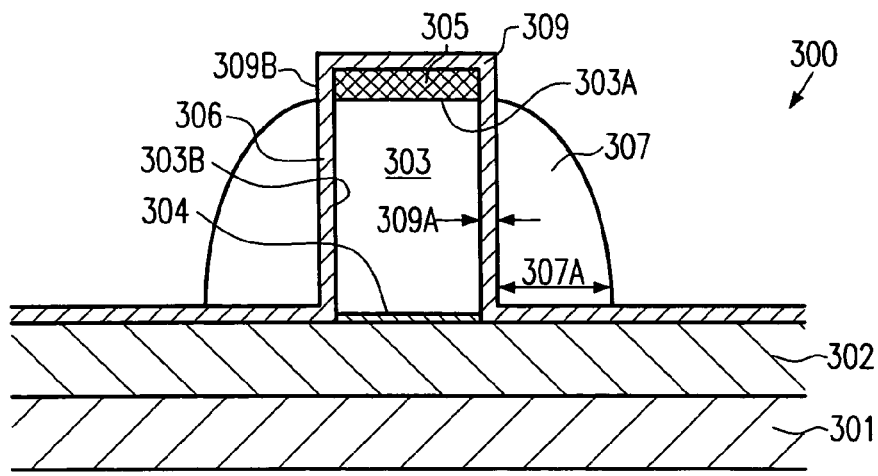
FIGS. 3a–3c schematically show a semiconductor device having raised drain and source regions during various manufacturing stages, wherein an offset spacer is formed prior to the formation of disposable sidewall spacers according to further illustrative embodiments of the present invention.
Figure 3B:
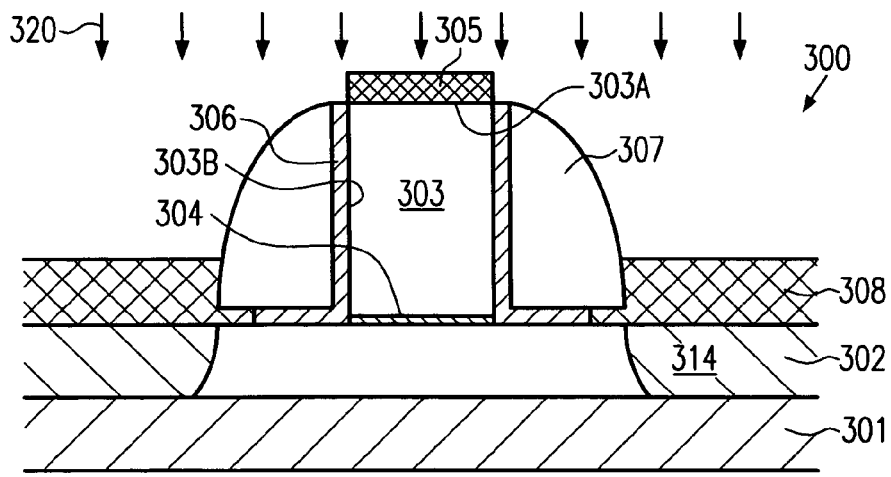
Figure 3C:
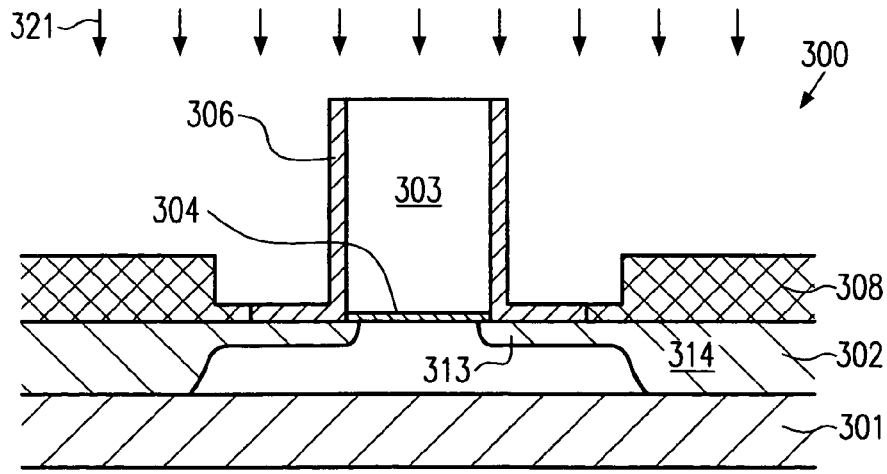

With reference to FIGS. 3a–3c, further illustrative embodiments of the present invention will now be described in more detail. In FIG. 3a, a semiconductor device 300 comprises a substrate 301 and a semiconductor layer 302 formed thereon. Regarding the substrate 301 and the semiconductor layer 302, the same criteria apply here as have already been described with reference to FIGS. 1a and 2a. The device 300 further comprises a gate electrode 303 formed on a gate insulation layer 304 that separates the gate electrode 303 from the semiconductor layer 302. A top surface 303a of the gate electrode 303 is covered by a cap layer 305, while an offset spacer layer 309 covers the cap layer 305 and sidewalls 303b of the gate electrode 303, as well as a surface of the semiconductor layer 302. The offset spacer layer 309 is substantially conformally formed and has a thickness 309a that is selected in accordance with process requirements for an implantation process for forming extension regions in subsequent implantation processes. That is, the thickness 309a is selected so as to substantially correspond to a thickness of the offset spacers 109 described in FIG. 1d when both devices are to be formed according to the same design criteria.

The device 300 further comprises sidewall spacers 307 having a width 307a that is designed so as to provide the required offset to the gate electrode 303 when forming deep source and drain regions by means of ion implantation. Regarding the size of the spacer width 307a, the same criteria apply in this case as already pointed out with reference to the sidewall spacers 207 in FIG. 2a.

The device 300 may be formed according to the conventional process flow as described with reference to FIG. 1a so as to provide the substrate 301, the semiconductor layer 302, the gate insulation layer 304, and the gate electrode 303 with the cap layer 305 formed thereon. Contrary to the conventional process flow, thereafter the offset spacer layer 309, for instance comprised of silicon dioxide, may be formed by, for example, plasma enhanced chemical vapor deposition, wherein, in some embodiments, it may be considered advantageous in view of an increased reliability of the gate insulation layer 304 to form a thin oxide liner (not shown) by oxidizing the device 300 prior to the deposition of the offset spacer layer 309. In other embodiments, the liner 309 may be formed entirely by oxidation, wherein the reduction in the gate length, i.e., the lateral dimension in FIG. 3a, of the gate electrode 303 may be taken into account by the lithographic patterning of the gate electrode 303. In this case, the liner 309 will substantially not be formed on the cap layer 305. Next, a spacer layer (not shown), for instance comprised of silicon nitride, may be deposited and may be subjected to an anisotropic etch process to form the sidewall spacers 307, wherein, in one particular embodiment, the anisotropic etch process is continued until an upper sidewall portion 309b of the offset spacer layer 309 is exposed. During the anisotropic etch process, the offset spacer layer 309 may reliably stop the anisotropic etch process. Thereafter, exposed portions of the offset spacer layer 309 may be removed, for instance by hydrogenated fluoride (HF) if the offset spacer layer 309 is comprised of silicon dioxide, and exposed portions of the semiconductor layer 302 may then be subjected to any pre-clean processes so as to remove material residues, especially oxide residues, prior to an epitaxial growth process.

FIG. 3b schematically shows the semiconductor device 300 after completion of an epitaxial growth process to form raised semiconductor regions 308 adjacent to the sidewall spacers 307. Thereafter, the device 300 is subjected to an ion implantation 320, thereby forming deep source and drain regions 314 in the semiconductor layer 302, wherein the sidewall spacers 307 act as an implantation mask in a similar way as has already been described with reference to FIG. 2a. The parameters of the implantation 320 may be adapted in a way, as is described with reference to FIG. 2a, so as to compensate for the cap layer 305 covering the gate electrode 303 during the implantation 320.

FIG. 3c schematically shows the device 300 with the sidewall spacers 307 and the cap layer 305 removed and with extension regions 313 formed adjacent to the drain and source regions 314. The removal of the sidewall spacers 307 and of the cap layer 305 may be accomplished in a similar way as in the conventional process, for instance, by a selective etch process using hot phosphoric acid if the sidewall spacers 307 and the cap layer 305 are substantially comprised of silicon nitride. Thereafter, the device 300 is subjected to a further implantation process 321 so as to form the extension regions 313. The further manufacturing sequence may be continued as is described with reference to FIG. 1d, that is, a further sidewall spacer (not shown) may be formed and a further implantation process may be carried out if a higher degree of lateral profiling of the extension regions 313 is required. In other cases, the lateral dopant profile as shown in FIG. 3c may be sufficient for obtaining the desired transistor performance and a further sidewall spacer may be formed so as to act as a mask for a subsequent silicidation process in forming a metal silicide region in the gate electrode 303 and the raised semiconductor regions 308. In any case, using the sidewall spacers 307 as an implantation mask and additionally forming the offset spacer layer 309 with the required thickness 309a significantly reduces the required number of process steps in obtaining a desired lateral dopant profile in the semiconductor layer 302. Hence, reduced production costs and an improved yield may be achieved.

Figure 4A:
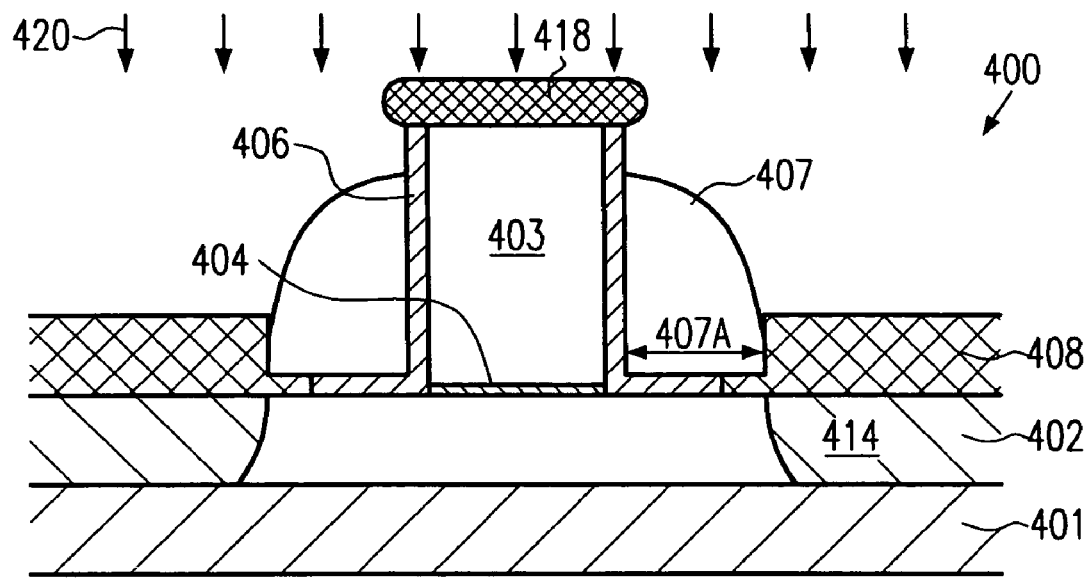
FIGS. 4a–4b schematically show a semiconductor device having raised drain and source regions, wherein disposable sidewall spacers are over-etched so as to expose an upper surface of a gate electrode prior to an epitaxial growth process.
Figure 4B:
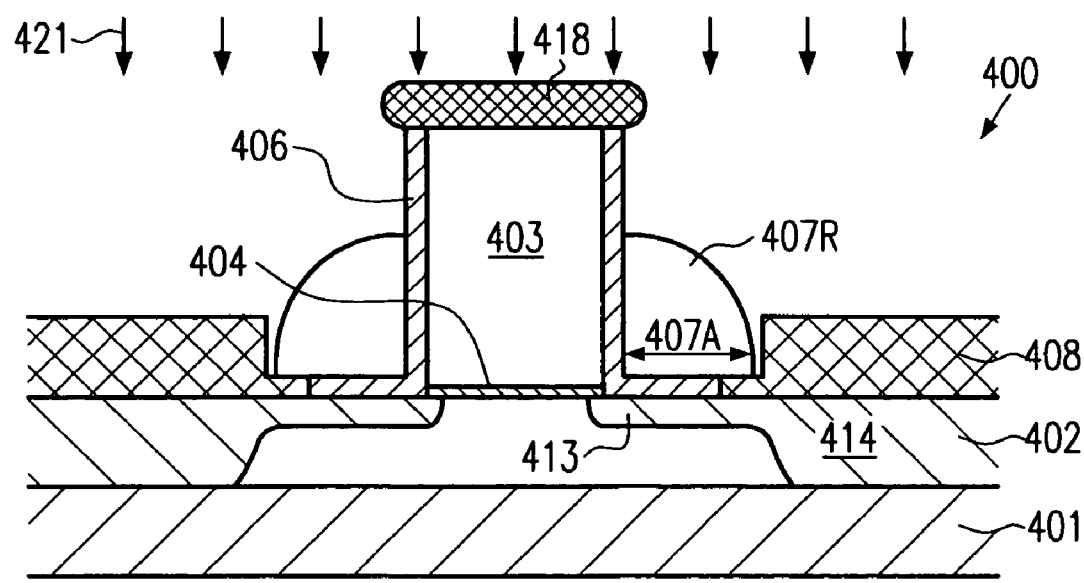

With reference to FIGS. 4a and 4b, further illustrative embodiments of the present invention will now be described, wherein an additional semiconductor region is epitaxially grown on a gate electrode, which may in some cases be considered appropriate. In FIG. 4a, a semiconductor device 400 comprises a substrate 401 and a semiconductor layer 402 having the same characteristics as is already described with reference to FIGS. 1a, 2a and 3a. Moreover, the device 400 comprises a gate electrode 403 formed on a gate insulation layer 404 that separates the gate electrode 403 from the semiconductor layer 402. A liner 406 is formed on the sidewalls of the gate electrode 403. Sidewall spacers 407 are formed adjacent to the liner 406, wherein a height of the spacers 407 may be less than a height of the gate electrode 403. Epitaxially grown semiconductor regions 408 are formed adjacent to the sidewall spacers 407 and a corresponding epitaxially grown semiconductor region 418 is formed on top of the gate electrode 403, and thus represents a part thereof. Furthermore, deep source and drain regions 414 are formed in the semiconductor layer 402.

A typical process flow may comprise substantially the same process steps as previously described with reference to FIGS. 1a, 2a and 3a, wherein additionally a cap layer (not shown) formed on top of the gate electrode 403 is removed during or after the process for forming the sidewall spacers 407. In one embodiment, the removal of the cap layer may be achieved by continuing the anisotropic etch process for forming the sidewall spacers 407 until the upper surface of the gate electrode 403 is substantially completely exposed. Since typically a width 407a of the sidewall spacers 407 exceeds a thickness of the cap layer, the gate electrode 403 will be exposed prior to the clearance of the surface of the semiconductor layer 402. Hence, the ongoing anisotropic process may remove material from the gate electrode 403, which may, however, be acceptable since during a subsequent epitaxial growth process the semiconductor region 418 may more than compensate for the material loss during the anisotropic etch process.

In another illustrative embodiment, the sidewall spacers 407 are formed in accordance with the conventional process flow having substantially the same height as the gate electrode 403, wherein afterwards the cap layer is removed by a selective isotropic etch process, for instance using hot phosphoric acid, thereby also reducing the size of the sidewall spacers 407, as is shown in FIG. 4a. Thus, any material removal of the gate electrode 403 during the isotropic etch process is negligible due to the high selectivity, and the epitaxially grown region 418 effectively increases the dimensions of the gate electrode 403. In one embodiment, the height of the gate electrode 403 as initially deposited may be selected so as to result, in combination with the thickness of the epitaxially grown region 418, in the desired total design height for the gate electrode 403. Hence, the patterning of the gate electrode 403 with the initial reduced height may occur more efficiently since a thinner gate electrode material has to be patterned by the complex photolithography and anisotropic etch techniques. Moreover, during a subsequent ion implantation 420 using the sidewall spacers 407 as an implantation mask, substantially the same implantation parameters may be used since now the effective height of the gate electrode 403 including the epitaxially grown region 418 may be selected so as to correspond to the height of the gate electrode 103 in FIG. 1c when the same device design is considered. After completion of the ion implantation 420 for forming the source and drain regions 414, the sidewall spacers 407 may be removed, for instance by a selective etch process with hot phosphoric acid, or may, in other embodiments, further be reduced in size by an anisotropic or isotropic etch process.

FIG. 4b schematically shows the device 400 with the sidewall spacers having a reduced size, indicated as 407r. Moreover, the device 400 is exposed to a further ion implantation 421 to form extension regions 413 adjacent to the drain and source regions 414. During the ion implantation 421, the reduced spacers 407r serve as an implantation mask, wherein the degree of the ion blocking effect may be adjusted by the degree of size reduction obtained, for instance, by an isotropic etch process. In other embodiments, the sidewall spacers 407 as shown in FIG. 4a may be completely removed prior to the implantation 421, which may then be carried out with an additionally formed offset spacer (not shown) or any other additional sidewall spacers (not shown), as is described in the conventional process flow or with reference to FIG. 2b. Moreover, it should be noted that the embodiments shown in FIGS. 4a and 4b may be readily combined with the embodiments shown in, and described with reference to, FIGS. 3a–3c. That is, the liner 406 may be formed with a required thickness so as to serve as an offset spacer during, for instance, the ion implantation 421 after removal or size reduction of the sidewall spacer 407.

After the implantation 421, the manufacturing process may be continued by, for instance, completely removing the spacers 407r, or by further reducing the size thereof and performing a further implantation so as to obtain an advanced lateral dopant profile. Irrespective of the further process flow selected, a significant reduction in process steps and thus of production costs in combination with a reduced risk of creating defects is accomplished with the embodiments shown in FIGS. 4a and 4b, wherein, due to the region 418, an increased gate area is provided or well-established implantation parameters may be used.

Figure 5A:
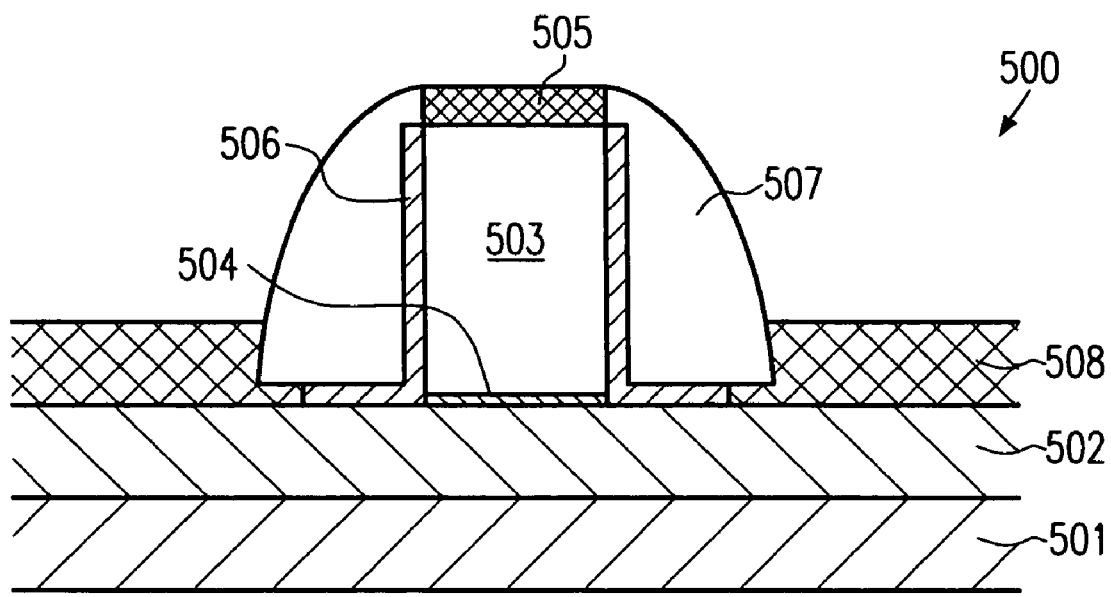
FIGS. 5a–5b schematically show a semiconductor device having raised drain and source regions, wherein the size of sidewall spacers used for selectively epitaxially growing the raised drain and source regions is reduced prior to an implantation sequence.
Figure 5B:
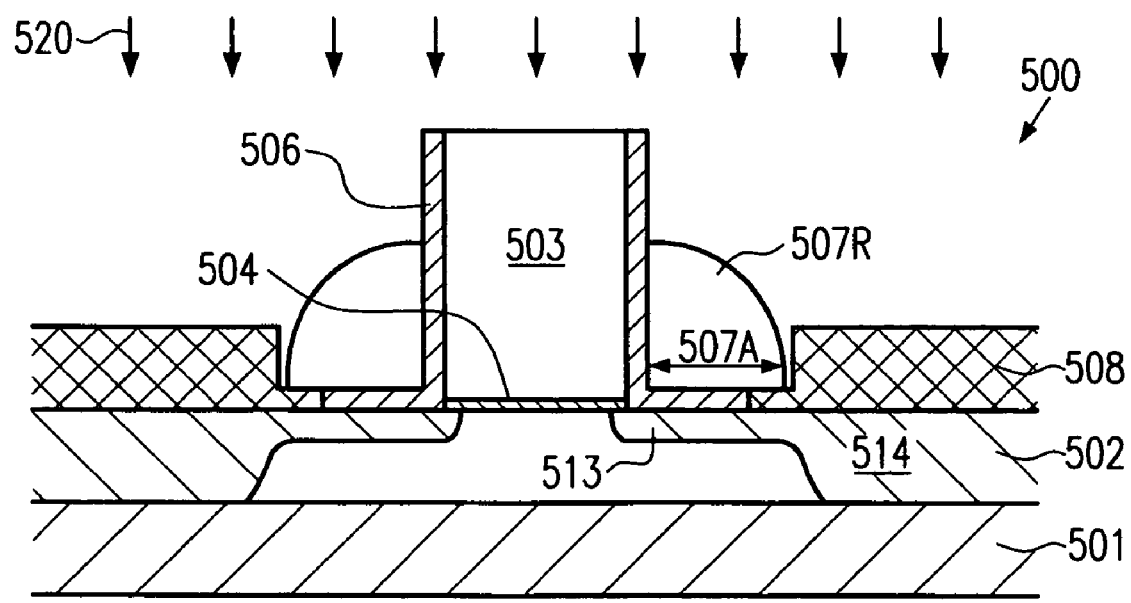

With reference to FIGS. 5a and 5b, further illustrative embodiments of the present invention will now be described. In FIG. 5a, a semiconductor device 500 comprises a substrate 501 and a semiconductor layer 502 formed thereon. A gate electrode 503 is formed on a gate insulation layer 504 that separates the gate electrode 503 from the semiconductor layer 502. A liner 506 separates a sidewall spacer 507 from the gate electrode 503. A cap layer 505 covers a top surface of the gate electrode 503. Finally, raised semiconductor regions 508 are formed adjacent to the sidewall spacers 507. Regarding the configuration of the individual components as well as the manufacturing process of the device 500, the same criteria apply as already explained with reference to the preceding embodiments and with reference to the conventional process flow. Contrary to the conventional flow, however, the device 500 is exposed to a reactive ambient so as to remove the cap layer 505 prior to performing an implantation step. To this end, an anisotropic etch process may be performed to remove the cap layer 505 and to also reduce the size of the sidewall spacers 507 without substantially affecting a width thereof. During the anisotropic etch process for removing the cap layer 505, a certain amount of semiconductor material may also be removed from the epitaxially grown regions 508, wherein a corresponding material removal may have previously been accounted for by correspondingly increasing a deposition thickness during the epitaxial growth process. In a further illustrative embodiment, the gate electrode 503 may be exposed by removing the cap layer 505 in an isotropic etch process using, for instance hot phosphoric acid, thereby also reducing the size of the sidewall spacers 507.

FIG. 5b schematically shows the device 500 after the removal of the cap layer 505, thereby creating sidewall spacers of reduced dimensions, indicated by 507r. In the embodiment shown in FIG. 5b, the reduction in size is accomplished by an isotropic etch process, thereby also reducing an initial width of the spacers 507r, which is indicated as 507a. Moreover, source and drain regions 514 and corresponding extension regions 513 are formed by a correspondingly designed implantation process 520. Since the sidewall spacers 507r having the reduced size 507a are used as an implantation mask, an improved lateral dopant profile may be obtained for a given device configuration when using the same implantation parameters as in the conventional process flow. That is, the reduced blocking effect of the sidewall spacers 407r compared to sidewall spacers having a height corresponding to the gate electrode 503 create the extension regions 513 during the formation of the drain and source regions 514 while the situation for the gate electrode 503 remains the same as in the conventional process due to the removal of the cap layer 505 prior to the implantation 520. The blocking effect of the sidewall spacers 507r and thus the desired profiling effect may be adjusted by correspondingly controlling the etch process for removing the cap layer 505. In other embodiments, the size reduction of the spacers 507 during the removal of the cap layer 505 may be negligible when an anisotropic etch process is used so that substantially the same profiling as in the conventional case is achieved.

Subsequently, the manufacturing process may be continued by further reducing the size of the sidewall spacers 507r and performing a further implantation sequence so as to enhance the dopant profile of the extension region 513, or in other embodiments the spacer 507r may be completely removed and a further profiling of the dopant concentration may be performed as is previously described. It should be appreciated that the above-described embodiments may be readily combined with the previously described embodiments when considered appropriate. For instance, the liner 506 may be formed similarly to the spacer layer 309 shown in FIGS. 3a–3c, thereby further reducing the number of required process steps in obtaining a desired dopant profile for the extension regions 513 and the drain and source regions 514. In other embodiments, the spacers 507r and the implantation 520 may suffice for obtaining the required transistor performance, or the spacers 507r may further be reduced prior to a subsequent implantation, wherein the residue of the spacers 507r may then be maintained and used during a subsequent silicidation process, whereby upper sidewall portions of the gate electrode 503 are then advantageously also available for the silicidation process, thereby imparting a increased conductivity to the gate electrode 503.

As a result, the present invention enables the formation of raised semiconductor regions adjacent to a gate electrode structure, wherein the process flow may be made more efficient compared to the conventional process flow in that at least one spacer formation process may be omitted by using sidewall spacers for both a local epitaxial growth for the raised source and drain regions and for at least one implantation sequence for profiling the lateral dopant concentration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode above a semiconductor region;
   forming sidewall spacers on sidewalls of said gate electrode;
   forming epitaxially grown raised semiconductor regions above said semiconductor region and adjacent to said sidewall spacers;
   introducing a dopant species into said raised semiconductor regions and said semiconductor region by ion implantation while using said sidewall spacers as an implantation mask; and
   removing a portion of said sidewall spacers and introducing a second amount of said dopant species into said semiconductor region through a remaining portion of said sidewall spacers.

2. The method of claim 1, further comprising:
   forming a layer of material on an upper surface of said gate electrode; and
   exposing said upper surface of said gate electrode prior to epitaxially growing said raised semiconductor regions so as to form an epitaxially grown region on said exposed upper surface of said gate electrode.

3. The method of claim 2, wherein forming said gate electrode includes depositing a layer of gate electrode material with a specified thickness and patterning said layer of gate electrode material, whereby said specified thickness is selected so as to substantially achieve a desired design height of said gate electrode in combination with a height of said semiconductor region epitaxially grown on said upper surface of said gate electrode.

4. The method of claim 2, wherein exposing said upper surface of said gate electrode includes anisotropically etching said layer of material formed on said upper surface during the formation of said sidewall spacers until said upper surface is exposed.

5. The method of claim 2, wherein said upper surface of said gate electrode is exposed during the formation of said sidewall spacers.

6. The method of claim 1, wherein a portion of said sidewall spacers is removed by a selective anisotropic etch process.

7. The method of claim 1, wherein a portion of said sidewall spacers is removed by a selective isotropic etch process.

* * * * *